United States Patent
Chen et al.

(10) Patent No.: US 11,170,843 B2
(45) Date of Patent: Nov. 9, 2021

(54) BITCELL WITH MULTIPLE READ BITLINES

(71) Applicant: Arm Limited, Cambridge (GB)

(72) Inventors: Andy Wangkun Chen, Austin, TX (US); Yew Keong Chong, Austin, TX (US); Sriram Thyagarajan, Austin, TX (US); Ettore Amirante, Nice (FR)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/824,663

(22) Filed: Mar. 19, 2020

(65) Prior Publication Data

US 2021/0295898 A1 Sep. 23, 2021

(51) Int. Cl.
*G11C 8/00* (2006.01)
*G11C 11/4097* (2006.01)
*G11C 5/02* (2006.01)
*G11C 11/408* (2006.01)
*G11C 11/4094* (2006.01)

(52) U.S. Cl.
CPC .......... *G11C 11/4097* (2013.01); *G11C 5/025* (2013.01); *G11C 11/4085* (2013.01); *G11C 11/4094* (2013.01)

(58) Field of Classification Search
CPC . G11C 11/4097; G11C 5/025; G11C 11/4085; G11C 11/4094
USPC .................................................. 365/230.03
See application file for complete search history.

(56) References Cited

U.S. PATENT DOCUMENTS

| | | | |
|---|---|---|---|
| 10,262,726 B1* | 4/2019 | Chang | G11C 11/412 |
| 2002/0065997 A1* | 5/2002 | Hsu | G11C 8/16 |
| | | | 711/158 |
| 2006/0143428 A1 | 6/2006 | Noda et al. | |
| 2010/0118593 A1* | 5/2010 | Cho | H01L 29/868 |
| | | | 365/148 |
| 2019/0096475 A1 | 3/2019 | Li et al. | |
| 2019/0295631 A1 | 9/2019 | Yadavalli | |

OTHER PUBLICATIONS

EPO Search Report and Opinion; EP 21161142.1; dated Jul. 28, 2021.

* cited by examiner

*Primary Examiner* — Huan Hoang
(74) *Attorney, Agent, or Firm* — Pramudji Law Group PLLC; Ari Pramudji

(57) ABSTRACT

Various implementations described herein are related to a device having a bitcell. The device may include horizontal bitlines coupled to the bitcell. The horizontal bitlines may include multiple first read bitlines disposed in a horizontal direction with respect to the bitcell. The device may include vertical bitlines coupled to the bitcell. The vertical bitlines may include multiple second read bitlines disposed in a vertical direction with respect to the bitcell.

20 Claims, 11 Drawing Sheets

1 Write Wordline (WWL) & 1 Read Wordline (RWL) & 1 Global Read Wordline (GRWL)

6 Horizontal Bitlines (HBL)
(WBL, NWBL, RBL_H0, RBL_H1, RBL_H2, RBL_H3, RBL_H4)

8 Vertical Bitlines (VBL)
(RBL_V0, RBL_V1, RBL_V2, RBL_V3, RBL_V4, RBL_V5, RBL_V6, RBL_V7)

1000A

Memory Array Circuitry 1002A

4 Banks of 128x16 Memory Arrays: Entry Read: 16 Entries with Each Entry having 64 Bytes (512 Bits)

Block Read: 16 Blocks of 32x16: Read 1 Block of 32x16: Read 512 Bitcells in 2 Cycles

4th Bank (Bank_3) (128x16)

| | | | | |
|---|---|---|---|---|
| block[15] | 8x8 | Mux + IO | SA + Drivers | 8x8 |
| block[14] | 8x8 | | | 8x8 |
| block[13] | 8x8 | Mux + IO | SA + Drivers | 8x8 |
| block[12] | 8x8 | | | 8x8 |
| block[15] | 8x8 | Mux + IO | SA + Drivers | 8x8 |
| block[14] | 8x8 | | | 8x8 |
| block[13] | 8x8 | Mux + IO | SA + Drivers | 8x8 |
| block[12] | 8x8 | | | 8x8 |
| | WDX | CLK IO | CLK | WDX |
| block[12] | 8x8 | Mux + IO | SA + Drivers | 8x8 |
| block[13] | 8x8 | | | 8x8 |
| block[14] | 8x8 | Mux + IO | SA + Drivers | 8x8 |
| block[15] | 8x8 | | | 8x8 |
| block[12] | 8x8 | Mux + IO | SA + Drivers | 8x8 |
| block[13] | 8x8 | | | 8x8 |
| block[14] | 8x8 | Mux + IO | SA + Drivers | 8x8 |
| block[15] | 8x8 | | | 8x8 |

3rd Bank (Bank_2) (128x16)

| | | | | |
|---|---|---|---|---|
| block[11] | 8x8 | Mux + IO | SA + Drivers | 8x8 |
| block[10] | 8x8 | | | 8x8 |
| block[9] | 8x8 | Mux + IO | SA + Drivers | 8x8 |
| block[8] | 8x8 | | | 8x8 |
| block[11] | 8x8 | Mux + IO | SA + Drivers | 8x8 |
| block[10] | 8x8 | | | 8x8 |
| block[9] | 8x8 | Mux + IO | SA + Drivers | 8x8 |
| block[8] | 8x8 | | | 8x8 |
| | WDX | CLK IO | CLK | WDX |
| block[8] | 8x8 | Mux + IO | SA + Drivers | 8x8 |
| block[9] | 8x8 | | | 8x8 |
| block[10] | 8x8 | Mux + IO | SA + Drivers | 8x8 |
| block[11] | 8x8 | | | 8x8 |
| block[8] | 8x8 | Mux + IO | SA + Drivers | 8x8 |
| block[9] | 8x8 | | | 8x8 |
| block[10] | 8x8 | Mux + IO | SA + Drivers | 8x8 |
| block[11] | 8x8 | | | 8x8 |

FIG. 10A

BITCELL WITH MULTIPLE READ BITLINES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional computing architecture, some multipliers are typically designed to handle a large number of calculations that need to be handled by an application, which may cause large delays for complex multiplier processing when handling large numbers in cross pattern calculations, such as matrices. These complex multiplier calculations are used in machine learning applications, and some types of conventional multiplier designs typically implement multi-bit logic that is built to handle large numbers. Also, some other multiplier designs may use various other multi-bit signed logic that is built to handle large numbers. However, these types of complex multipliers typically exhibit glitching and delay problems due to complicated and inefficient memory designs. Thus, there exists a need to improve physical design implementation of some multiplier circuitry so as to provide for more efficient binary multiplication operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 10A-10B illustrate a diagram of memory array circuitry with bitcells in multiple banks of 128×16 arrays in accordance with implementations described herein.

DETAILED DESCRIPTION

Figure 1:
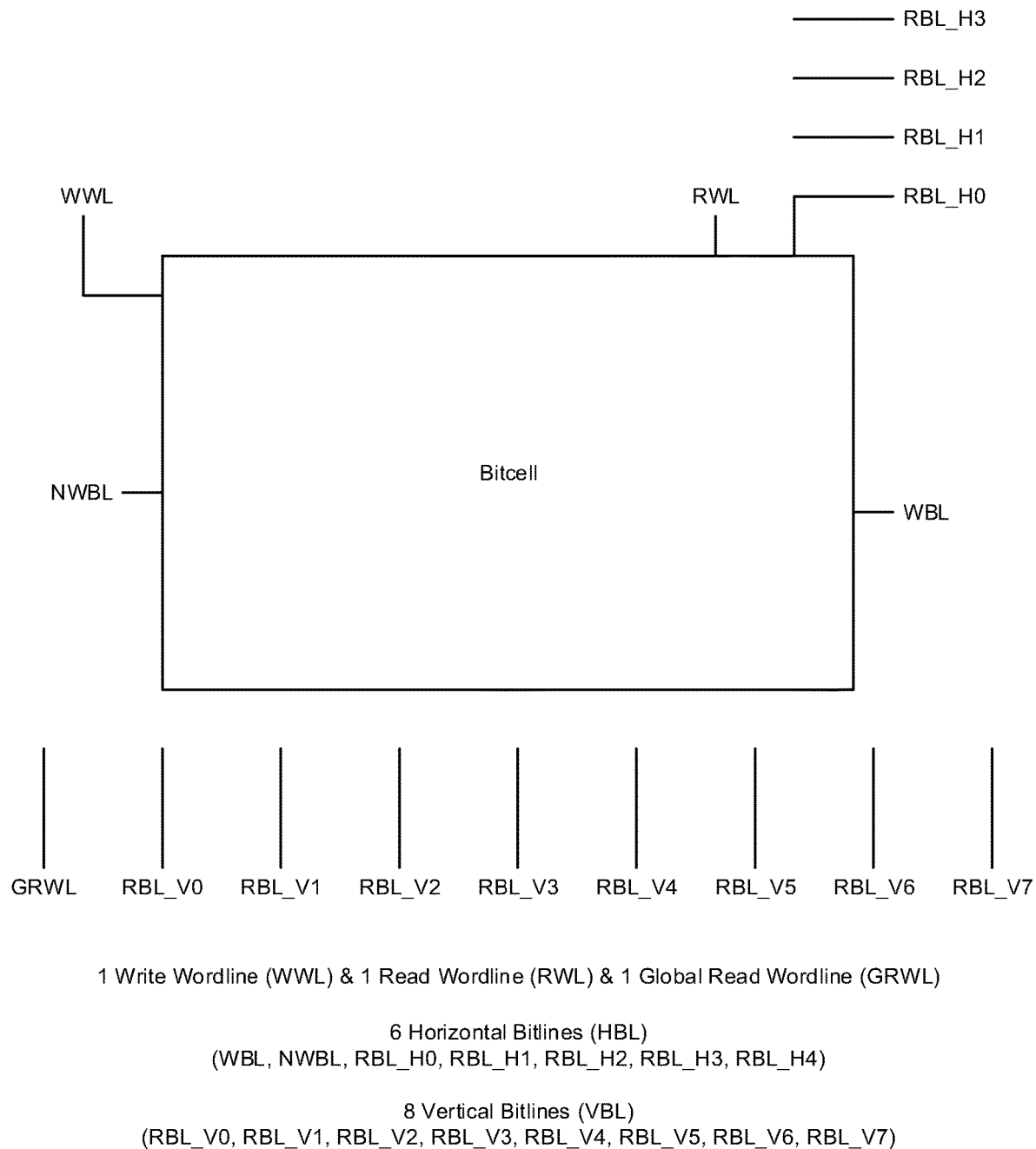
FIG. 1 illustrates a diagram of memory circuitry associated with a bitcell in accordance with various implementations described herein.

Various implementations described herein refer to memory architecture having bitcell circuitry with multiple read bitlines. For instance, various schemes and techniques described herein may provide for ultra-fast high-density memory architecture that may be used as custom memory for an in-core matrix accelerator. Some aspects of the various schemes and techniques described herein provide for sixteen (16) entries with 64 bytes per entry and with one (1) read or one (1) write per cycle. Also, the various schemes and techniques described herein may provide for write operations that may be configured to update all 64 bytes of an entry in a single cycle. Also, the various schemes and techniques described herein may also provide multiple modes for read operations, such as, e.g., a single entry read and a block read. For instance, the single entry read may refer to reading all 64 bytes (i.e., read 512 bits) of an entry in a single cycle, and the block read may refer to reading the same 4 bytes for all 16 entries (i.e., read 512 bits) in a single cycle.

In some implementations, various schemes and techniques described herein may provide for a write operation that updates all 64 bytes of an entry in a single cycle, e.g., by writing data to four (4) banks of 128×16 bitcells via activation of a single write wordline (WWL), wherein this technique is used to write 512 bits in a single cycle. Also, in some implementations, various schemes and techniques described herein may provide for an entry read operation that reads all 64 bytes of an entry in a single cycle, e.g., by reading data from four (4) banks of 128×16 bitcells via activation of a single read wordline (RWL), wherein this technique is used to read 512 bits in a single cycle. Further, in some implementations, the various schemes and techniques described herein may provide for a block read operation that block reads a 32×16 bitcell array in a single cycle, e.g., by block reading data from 512 bits in a single cycle.

Various implementations of high-density memory architecture will be described in greater detail herein with reference to FIGS. 1-9 and 10A-10B.

FIG. 1 illustrates a diagram 100 of memory circuitry 102 associated with a bitcell in accordance with various implementations described herein.

In various implementations, the memory circuitry 102 may be implemented as a system or a device having various integrated circuit (IC) components that are arranged and coupled together as an assemblage or combination of parts that provide for a physical circuit design and related structures. In some instances, a method of designing, providing and building the memory circuitry 102 as an integrated system or device may involve use of various IC circuit components described herein so as to implement the various memory array architecture associated therewith. The memory circuitry 102 may be integrated with computing circuitry and related components on a single chip, and the memory circuitry 102 may be implemented in embedded systems for electronic, mobile and Internet-of-things (IoT) applications, including sensor nodes.

As shown in FIG. 1, the memory circuitry 102 may be associated with memory architecture that is implemented as a bitcell or memory cell. In some instances, the bitcell 104 may refer to a device or structure having a single bitcell that is configured to store a data bit that is accessible via multiple wordlines and multiple bitlines. The bitcell 104 may utilize multiple wordlines including a write wordline (WWL), a read wordline (RWL), and a global read wordline (GRWL) coupled to the bitcell. The bitcell 104 may utilize multiple horizontal bitlines (WBL, NWBL, RBL_H0, RBL_H1, RBL_H2, RBL_H3) coupled to the bitcell. The bitcell 104 may utilize multiple vertical bitlines (RBL_V0, RBL_V1, RBL_V2, RBL_V3, RBL_V4, RBL_V5, RBL_V6, RBL_V7, RBL_V8) coupled to the bitcell. Various aspects and structural features associated with various layout designs of memory array architecture of the memory circuitry 102 associated with the bitcell 104 along with various schemes and techniques related thereto is described in greater detail herein.

Figure 2:
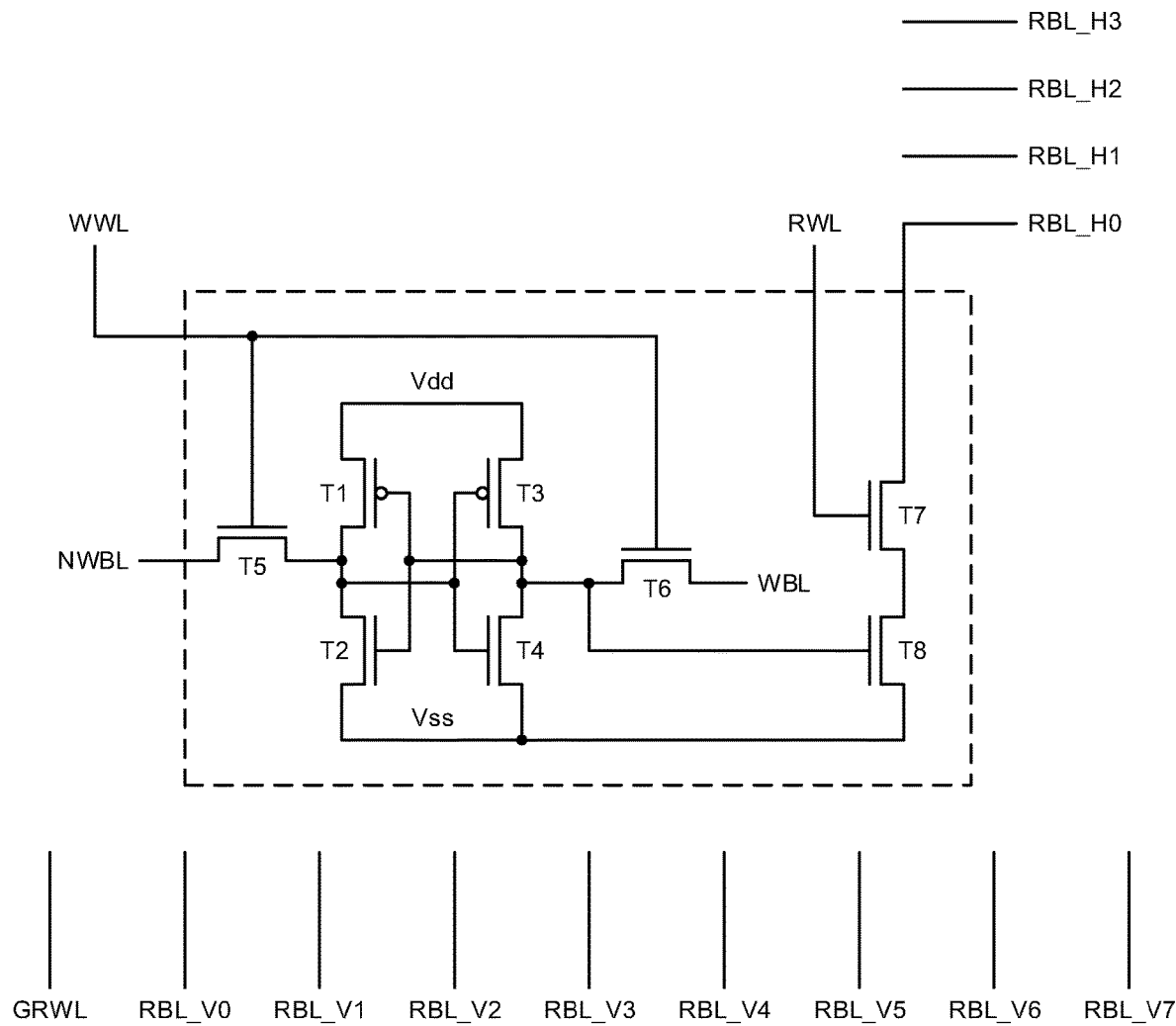
FIG. 2 illustrates a diagram of a bitcell structure in accordance with various implementations described herein.

FIG. 2 illustrates a diagram 200 of a bitcell structure 204 in accordance with various implementations described herein. In some implementations, the bitcell structure 204 of FIG. 2 is associated with the bitcell 104 of FIG. 1.

In various implementations, the bitcell structure 204 may be implemented as a memory device having various IC components that are arranged and coupled together as an assemblage or combination of parts that allow for a physical layout design and related structures. In some instances, a method of designing, providing and fabricating the bitcell structure 204 as an integrated device may involve use of various IC circuit components described herein so as to implement the various memory array architecture associated therewith. The bitcell structure 204 may be integrated with computing circuitry and related components on a single chip, and also, the bitcell structure 204 may be used in embedded systems for electronic, mobile and Internet-of-things (IoT) applications.

As shown in FIG. 2, the bitcell structure 204 may refer to a device having a single bitcell with multiple transistors that are arranged and configured to store a data bit that is accessible via multiple wordlines and multiple bitlines. In some implementations, the bitcell structure 204 may include eight transistors that are arranged and configured to provide a single 8-transistor (8T) bitcell. For instance, the bitcell structure 204 may include transistors (T1, T2) arranged as a first inverter, transistors (T3, T4) arranged as a second inverter, write access transistors (T5, T6), and read transistors (T7, T8). Also, the bitcell structure 204 may include multiple wordlines including a write wordline (WWL), a read wordline (RWL), and a global read wordline (GRWL). The write wordline (WWL) may be coupled to gates of transistors (T5, T6), and the read wordline (RWL) may be coupled to a gate of transistor (T7). Also, a first write bitline (WBL) may be coupled to transistor (T6), and a second write bitline (NWBL) may be coupled to transistor (T5).

In some implementations, the bitcell structure 204 may have multiple horizontal bitlines (WBL, NWBL, RBL_H0, RBL_H1, RBL_H2, RBL_H3) coupled to the bitcell. The multiple horizontal bitlines may include first read bitlines (RBL_H0, RBL_H1, RBL_H2, RBL_H3) disposed in a horizontal direction with respect to the bitcell, and the multiple horizontal bitlines may also include the first write bitline (WBL) and the second write bitline (NWBL) that is a complement to the first write bitline (WBL). Therefore, the horizontal bitlines may include six horizontal bitlines that include the four (4) horizontal read bitlines (RBL_H0, RBL_H1, RBL_H2, RBL_H3) along with the two horizontal write bitlines (WBL, NWBL) that are disposed in the horizontal direction with respect to the bitcell.

In some implementations, the bitcell structure 204 may have multiple vertical bitlines (RBL_V0, RBL_V1, RBL_V2, RBL_V3, RBL_V4, RBL_V5, RBL_V6, RBL_V7, RBL_V8) coupled to the bitcell. The multiple vertical bitlines may refer to multiple second read bitlines (RBL) disposed in a vertical direction with respect to the bitcell, and also, the second read bitlines may include eight (8) vertical read bitlines that are disposed in the vertical direction with respect to the bitcell.

Figure 3:
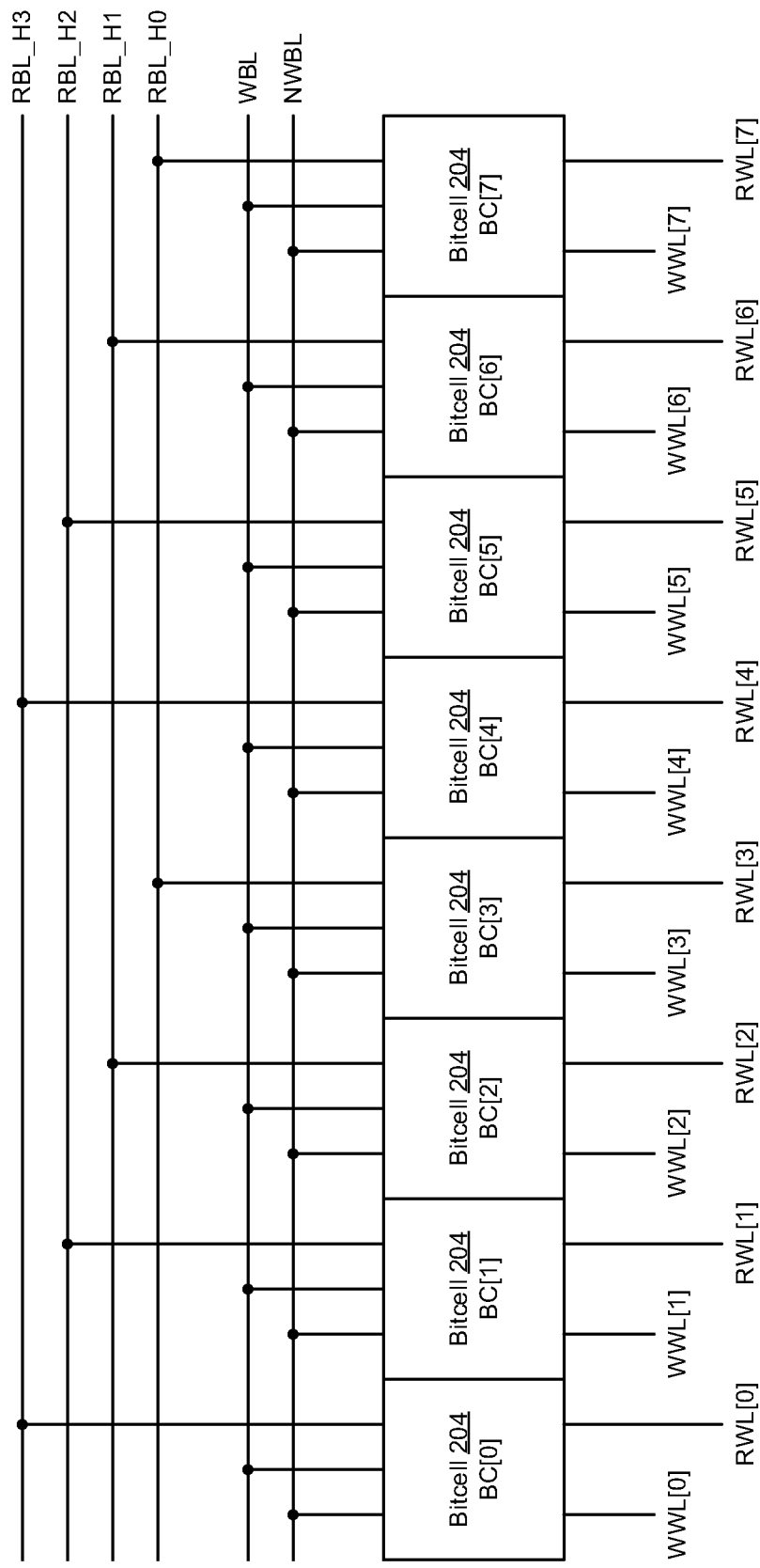
FIG. 3 illustrates a diagram of memory array circuitry with bitcells arranged in a 1×8 array in accordance with implementations described herein.

FIG. 3 illustrates a diagram 300 of memory array circuitry 302 with the bitcells 204 arranged in a 1×8 array in accordance with implementations described herein.

As shown in FIG. 3, the memory array circuitry 302 may include the 1×8 array of bitcells 204 that are arranged in a single row of 8 bitcells 204. The 1×8 array of bitcells 204 may be arranged in the single row of bitcells 204 and may include a first bitcell BC[0], a second bitcell BCH, a third bitcell BC[2], a fourth bitcell BC[3], a fifth bitcell BC[4], a sixth bitcell BC[5], a seventh bitcell BC[6], and an eighth bitcell BC[7] that are coupled to corresponding write wordlines (WWL) and read wordlines (RWL). In some instances, a first write wordline WWL[0] and a first read wordline RWL[0] may be coupled to the first bitcell BC[0], a second write wordline WWL[1] and a second read wordline RWL[1] may be coupled to the second bitcell BCH, and so on to an eight write wordline WWL[7] and an eighth read wordline RWL[8] that is coupled to the eighth bitcell BC[7]. (***GRWL not shown in FIG. 3; Note to Inventor: should the drawings be updated to show the GRWL?). Also, in some instances, each bitcell 204 may have eight transistors that are arranged and configured to provide an 8-transistor (8T) bitcell in the row of 8 bitcells 204.

In some implementations, the horizontal bitlines (RBL_H0, RBL_H1, RBL_H2, RBL_H3) may be coupled to the bitcells 204 in the 1×8 array, and the horizontal bitlines (RBL_H0, RBL_H1, RBL_H2, RBL_H3) may include the first read bitlines disposed in a horizontal direction with respect to the array of bitcells. The first read bitlines (RBL_H0, RBL_H1, RBL_H2, RBL_H3) include the four (4) horizontal read bitlines that are disposed in the horizontal direction with respect to the bitcells 204. In some instances, a first read bitline (RBL_H0) may be coupled to the fourth bitcell BC[3] and the eighth bitcell BC[7], and a second read bitline (RBL_H1) may be coupled to the third bitcell BC[2] and the seventh bitcell BC[6]. Also, a third read bitline (RBL_H2) may be coupled to the second bitcell BCH and the sixth bitcell BC[5], and a fourth read bitline (RBL_H3) may be coupled to the first bitcell BC[0] and the fifth bitcell BC[4].

In some implementations, the horizontal bitlines may also include the first write bitline (WBL) along with the second write bitline (NWBL) that is a complement to the first write bitline (WBL). As shown in FIG. 3, the write bitlines (WBL, NWBL) are coupled to each of the bitcells 204 in the 1×8 array of bitcells. Therefore, as shown, the 1×8 array of bitcells 204 may include eight (8) bitcells that are arranged in a single row with eight (8) columns, and at least four (4) bitcells 204 in the 1×8 array may be read in a single cycle, such as, e.g., a read cycle (READ) during a read operation. Also, in some instances, the 1×8 bitcell array may be configured to allow for at least four (4) wordlines to be active and read in a single cycle, such as, e.g., a read cycle (READ) during a read operation.

Also, in some implementations, the multiple vertical bitlines (RBL_V0, RBL_V1, RBL_V2, RBL_V3, RBL_V4, RBL_V5, RBL_V6, RBL_V7, RBL_V8) disclosed in reference to FIG. 2 may be coupled to the bitcells 204 in the 1×8 array of FIG. 3, and the vertical bitlines may refer to second read bitlines disposed in a vertical direction with respect to the 1×8 array of bitcells 294. Further, in some instances, the second read bitlines may include the eight (8) vertical read bitlines (RBL_V0, RBL_V1, RBL_V2, RBL_V3, RBL_V4, RBL_V5, RBL_V6, RBL_V7, RBL_V8) that are disposed in the vertical direction with respect to the bitcells 204 in the 1×8 array.

Moreover, in some implementations, the 1×8 array of bitcells 204 as shown in FIG. 3 may be modified to include additional rows of bitcells 204 in a larger array. For instance, the 1×8 array may be modified to include 8 copies of the 1×8 bitcell arrays, e.g., by extending the 1×8 bitcell array to include 8 rows of bitcells 204 so as to thereby provide an 8×8 array of bitcells 204. In this instance, the memory circuitry 302 shown in FIG. 3 may be adapted to provide an 8×8 array of bitcells 204 that may include sixty-four (64) bitcells that are arranged in eight (8) rows with eight (8) columns, and also, thirty-two (32) bitcells of the bitcells 204 in the 8×8 array may be read in a single cycle, such as, e.g., a read cycle (READ) during a read operation. Also, in some instances, the 8×8 bitcell array may be configured to allow for at least four (4) wordlines to be active and read in a single cycle, such as, e.g., a read cycle (READ) during a read operation.

Figure 4:
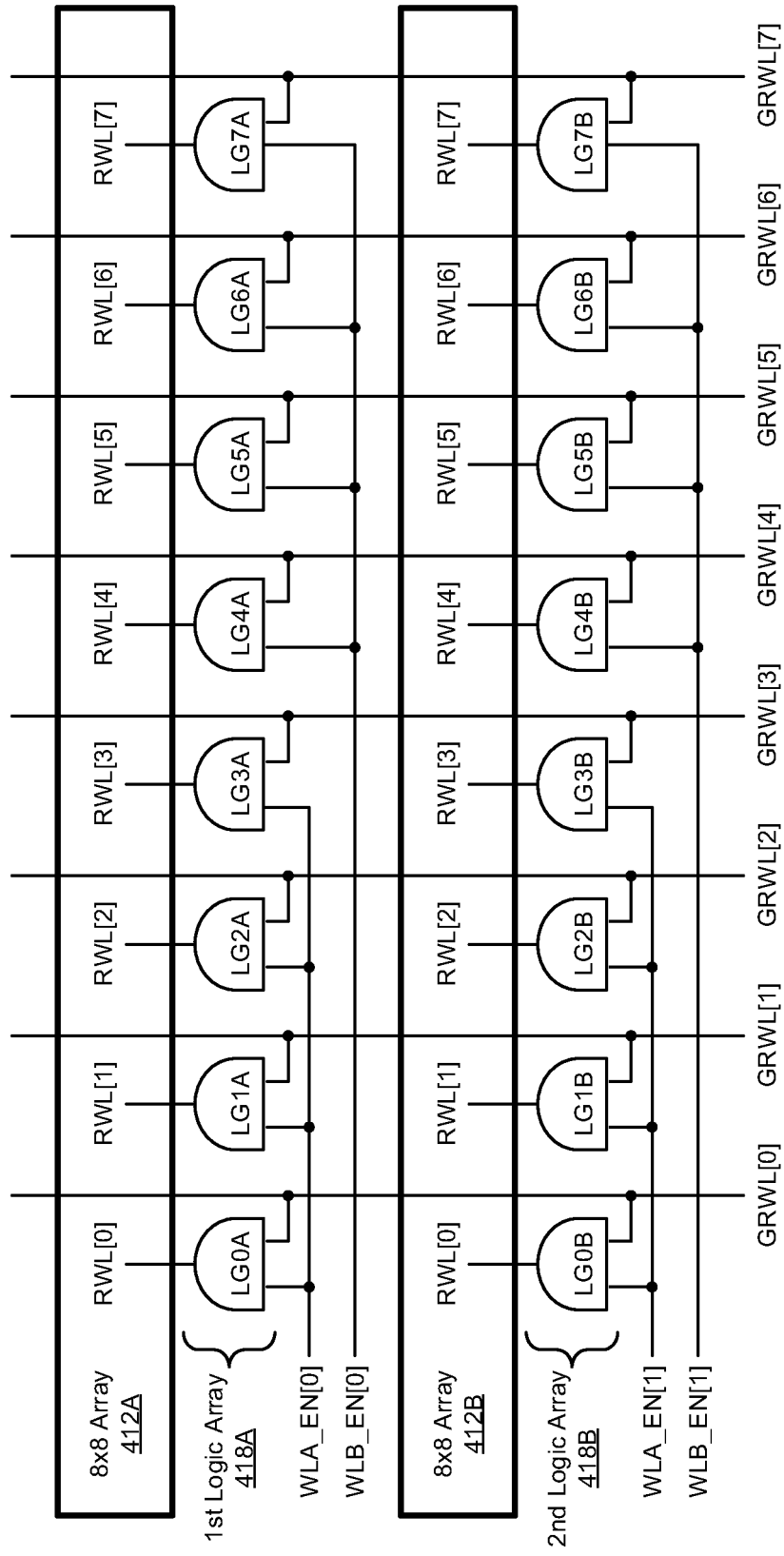
FIG. 4 illustrates a diagram of memory array circuitry with bitcells arranged in a 16×8 array in accordance with implementations described herein.

FIG. 4 illustrates a diagram 400 of memory array circuitry 402 with the bitcells 204 arranged in a 16×8 array in accordance with implementations described herein.

As shown in FIG. 4, the memory array circuitry 402 may include multiple 8×8 arrays of bitcells 204 that are arranged in a multiple blocks or banks of 8×8 bitcell arrays 412A, 412B. The memory array circuitry 402 may also include multiple logic arrays 418A, 418B that are coupled to the multiple 8×8 bitcell arrays 412A, 412B, wherein the multiple logic arrays 418A, 418B are configured to access data stored in bitcells 204 of the multiple 8×8 bitcell arrays 412A, 412B. For instance, a first logic array 418A may be coupled to a first 8×8 bitcell array 412A via multiple logic gates (LG0A, LG1A, LG7A), and data stored in bitcells 204 of the first 8×8 bitcell array 412A may be accessed with multiple read wordlines (RWL[0], RWL[1], . . . , RWL[7]) and multiple global read wordlines (GWRL[0], GRWL[1], . . . , GWRL[7]).

In some instances, in reference to the first logic array 418A, a first write wordline signal (WLA_EN[0]) may be provided to first logic gates (LG0A, LG1A, LG2A, LG3A) along with a global read enable signal via global read wordlines (GWRL[0], GRWL[1], GRWL[2], GWRL[3]) for selecting one or more corresponding read wordline (RWL [0]. RWL[1], RWL[2], RWL[3]) in the first 8×8 bitcell array 412A. Also, a second write wordline signal (WLB_EN[0]) may be provided to second logic gates (LG4A, LG5A, LG6A, LG7A) along with a global read enable signal via global read wordlines (GWRL[4], GRWL[5], GRWL[6], GWRL[7]) for selecting one or more corresponding read wordlines (RWL[4], RWL[5], RWL[6], RWL[7]) in the first 8×8 bitcell array 412A. Also, in some instances, the first logic array 418A may be coupled to sixty-four (64) bitcells in a first block of the 8×8 bitcell array 412A for accessing data stored in the first block.

In some instances, in reference to the second logic array 418B, a first write wordline signal (WLA_EN[1]) may be provided to second logic gates (LG0B, LG1B, LG2B, LG3B) along with a global read enable signal via global read wordlines (GWRL[0], GRWL[1], GRWL[2], GWRL[3]) for selecting one or more corresponding read wordline (RWL [0]. RWL[1], RWL[2], RWL[3]) in the second 8×8 bitcell array 412B. Also, a second write wordline signal (WLB_EN [1]) may be provided to second logic gates (LG4B, LG5B, LG6B, LG7B) along with a global read enable signal via global read wordlines (GWRL[4], GRWL[5], GRWL[6], GWRL[7]) for selecting one or more corresponding read wordlines (RWL[4], RWL[5], RWL[6], RWL[7]) in the second 8×8 bitcell array 412B. In addition, the second logic array 418B may be coupled to sixty-four (64) bitcells in a second block of the 8×8 bitcell array 412B for accessing data stored in the second block.

Moreover, in some implementations, the 1×8 bitcell array as shown in FIG. 3 may be extended or modified to include the multiple 8×8 arrays 412A, 412B. For instance, the 1×8 array may be modified to include 8 copies of the 1×8 bitcell arrays for each 8×8 bitcell array 412A, 412B so as to thereby provide multiple 8×8 arrays of bitcells 204. In this instance, the memory circuitry 402 shown in FIG. 4 may be adapted to provide a 16×8 memory array of bitcells 204 that may include 2 copies of the 8×8 memory array having one-hundred twenty-eight (128) bitcells that are arranged in two (2) blocks of eight (8) rows and eight (8) columns. Also, sixty-four (64) bitcells in a first block of the 8×8 array 412A may be read in a first single cycle, such as, e.g., a first read cycle (READ) during a read operation. Also, sixty-four (64) bitcells in a second block of the 8×8 array 412A may be read in a second single cycle, such as, e.g., a second read cycle (READ) during the read operation. Thus, a double-pulse read operation may be used to read 128 bits in 2 cycles, wherein 64 bitcells are read in a first read cycle, and 64 other bitcells are read in a second read cycle. Also, the multiple blocks of 8×8 bitcell arrays 412A, 412B may be configured to allow for at least four (4) wordlines to be active and read in each read cycle of the double-pulse read cycles (READ) during the read operation.

Figure 5:
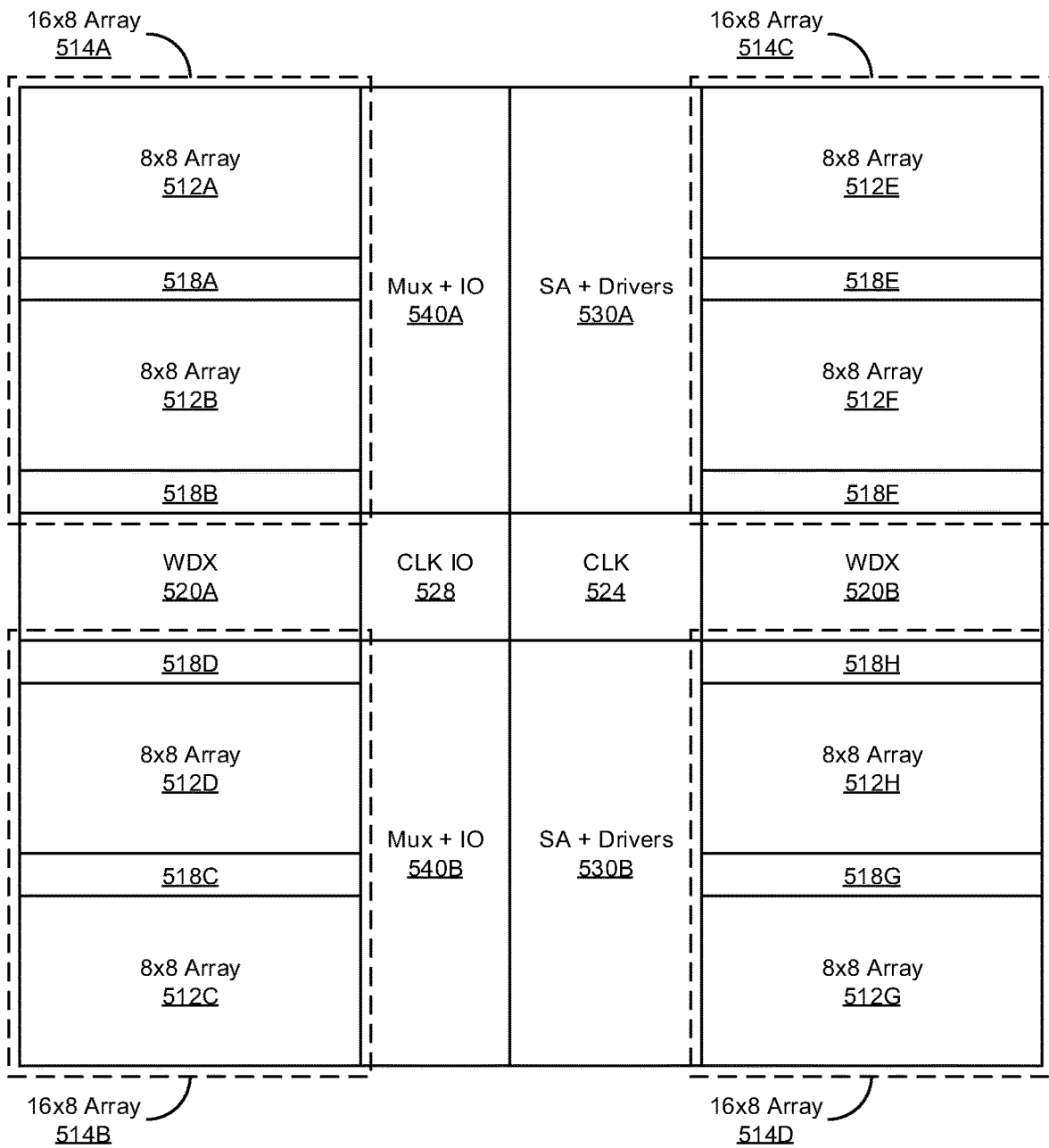
FIG. 5 illustrates a diagram of memory array circuitry with bitcells arranged in a 32×16 array in accordance with implementations described herein.

FIG. 5 illustrates a diagram 500 of memory array circuitry 502 with the bitcells 204 arranged in a 32×16 array in accordance with implementations described herein.

As shown in FIG. 5, the memory array circuitry 502 may include a 32×16 array having multiple blocks of 16×8 arrays (514A, 514B, 514C, 514D), which include multiple 8×8 arrays (512A, 512B, . . . , 512H). For instance, the 32×16 array 502 may include a first 16×8 array 514A with multiple 8×8 arrays 512A, 512B, and also, the 32×16 array 502 may include a second 16×8 array 514B with multiple 8×8 arrays 512C, 512D. In addition, the 32×16 array 502 may include a third 16×8 array 514C with multiple 8×8 arrays 512E, 512F, and also, the 32×16 array 502 may include a fourth 16×8 array 514D with multiple 8×8 arrays 512G, 512H. Also, in some instances, each 8×8 array (512A, 512B, . . . , 512H) may have corresponding logic arrays (518A, 518B, . . . , 518H) that function and operate in a manner as described in FIG. 4.

In some instances, the memory array circuitry 502 may include control circuitry for each block or bank of bitcell arrays, such as, e.g., an upper or top bank (514A, 514C) and a lower or bottom (bot) bank (514B, 514D). For instance, a first sense amplifier and driver logic (SA+Drivers) 530A along with a first multiplexer and input-output logic (Mux+IO) 540A may be provided as shared control circuitry for the upper bank having the first 16×8 array 514A and the third 16×8 array 514C. Also, a second sense amplifier and driver logic (SA+Drivers) 530B along with a second multiplexer and input-output logic (Mux+IO) 540B may be provided as shared control circuitry for the lower bank having the second 16×8 array 514B and the fourth 16×8 array 514D. In some instances, the memory array circuitry 502 may include other shared control circuitry, such as, e.g., first wordline driver circuitry (WDX) 520A for the first 16×8 array 514A and the second 16×8 array 514B along second first wordline driver circuitry (WDX) 520B for the third 16×8 array 514C and the fourth 16×8 array 514D. Further, in some instances, the memory array circuitry 502 may include clock circuitry (CLK) 524 and input-output clock circuitry (IO CLK) 528 that is shared between the four 16×8 arrays (514A, 514B, 514C, 514D).

Moreover, in some implementations, the 1×8 bitcell array as shown in FIG. 3 may be extended or modified to include the 32×16 memory array 502 having multiple 16×8 arrays 514A, 514B, 514C, 514D. For instance, the 1×8 array may be modified to include 8 copies of 8×8 bitcell arrays for each 16×8 bitcell array 514A, 514B, 514C, 514D so as to thereby provide the 32×16 memory array 502 of bitcells 204. In this instance, the 32×16 memory circuitry 502 shown in FIG. 5 may be adapted to provide a 32×16 memory array of bitcells 204 that may include 4 copies of the 16×8 memory array having five-hundred twelve (512) bitcells that are arranged in four (4) blocks of sixteen (16) rows and eight (8) columns. Also, two-hundred fifty-six (256) bitcells in a first block and a second block of the 16×8 arrays 512A, 512B may be read in a first single cycle, such as, e.g., a first read cycle (READ) during a read operation. Also, two-hundred fifty-six (256) bitcells in a third block and a fourth block of the 16×8 arrays 512C, 512D may be read in a second single cycle, such as, e.g., a second read cycle (READ) during the read operation. Therefore, a double-pulse read operation may be used to block read 512 bits in 2 cycles, wherein 256 bitcells are read in a first read cycle, and also 256 other bitcells are read in a second read cycle. Further, the multiple blocks of 16×8 bitcell arrays 514A, 514B, 514C, 514D may be configured to allow for at least eight (8) wordlines to be active and read in each read cycle of the double-pulse read cycles (READ) during the read operation.

Figure 6:
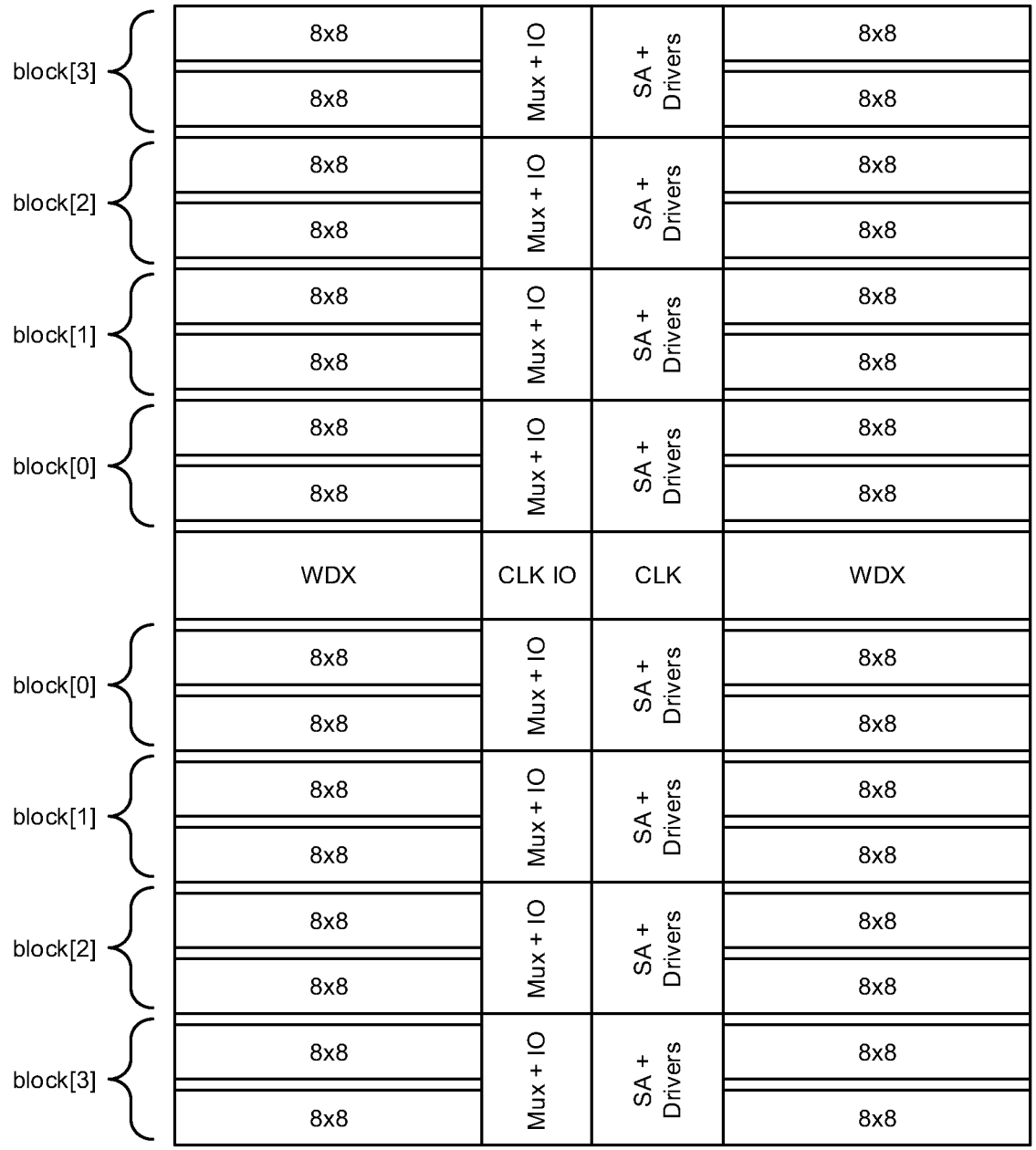
FIG. 6 illustrates a diagram of memory array circuitry with bitcells arranged in multiple blocks of 32×16 arrays in accordance with implementations described herein.

FIG. 6 illustrates a diagram 600 of memory array circuitry 602 with the bitcells arranged in multiple interleaved blocks of 32×16 bitcell arrays in accordance with various implementations described herein. In some implementations, the multiple blocks of 32×16 bitcell arrays may be interleaved to distribute pins during a write operation, wherein block reads may be performed on the same 4 bytes from all 16 entries.

As shown in FIG. 6, the memory array circuitry 602 includes multiple blocks of 32×16 arrays with each having multiple blocks of 16×8 arrays, which each have multiple 8×8 arrays. For instance, the multiple blocks of 32×16 arrays may include a first 32×16 block[0] array with eight (8) 8×8 arrays, and also, the multiple blocks of 32×16 arrays may include a second 32×16 block[1] array with eight (8) 8×8 arrays. In addition, the multiple blocks of 32×16 arrays may include a third 32×16 block[2] array with eight (8) 8×8 arrays, and also, the multiple blocks of 32×16 arrays may include a fourth 32×16 block[3] array with eight (8) 8×8 arrays. Also, in some instances, each 32×16 array (block[0], block[1], block[2], block[3]) may function and operate in a manner as described in FIG. 5.

Moreover, in some implementations, the 1×8 bitcell array as shown in FIG. 3 may be extended or modified to include the four (4) 32×16 memory block arrays (block[0], block[1], block[2], block[3]) with each having eight (8) 8×8 arrays. For instance, the 1×8 array may be modified to include 8 copies of 8×8 bitcell arrays for each 32×16 bitcell block array (block[0], block[1], block[2], block[3]) so as to thereby provide the 4 blocks of 32×16 memory arrays 602 of bitcells 204. In this instance, the 32×16 memory circuitry 502 as shown in FIG. 5 may be adapted to provide the 4 blocks of 32×16 memory bitcell arrays that may include 4 copies of the 32×16 memory arrays having five-hundred twelve (512) bitcells that are arranged and also interleaved in four (4) blocks of thirty-two (32) rows and sixteen (16) columns. Also, five-hundred twelve (512) bitcells in a first block and a second block of the 32×16 arrays (block[0], block[1]) may be read in a first single cycle, such as, e.g., a first read cycle (READ) during a read operation. Also, five-hundred twelve (512) bitcells in a third block and a fourth block of the 32×16 arrays (block[2], block[3]) may be read in a second single cycle, such as, e.g., a second read cycle (READ) during the read operation. Therefore, a double-pulse read operation may be used to block read 1024 bits in 2 cycles, wherein 512 bitcells are read in a first read cycle, and also 512 other bitcells are read in a second read cycle. Further, the multiple blocks of 32×16 bitcell block arrays (block[0], block[1], block[2], block[3]) may be adapted and configured to allow for at least eight (8) wordlines (e.g., 8 vertical wordlines) to be active and read in each read cycle of the double-pulse read cycles (READ) during the read operation.

Figure 7:
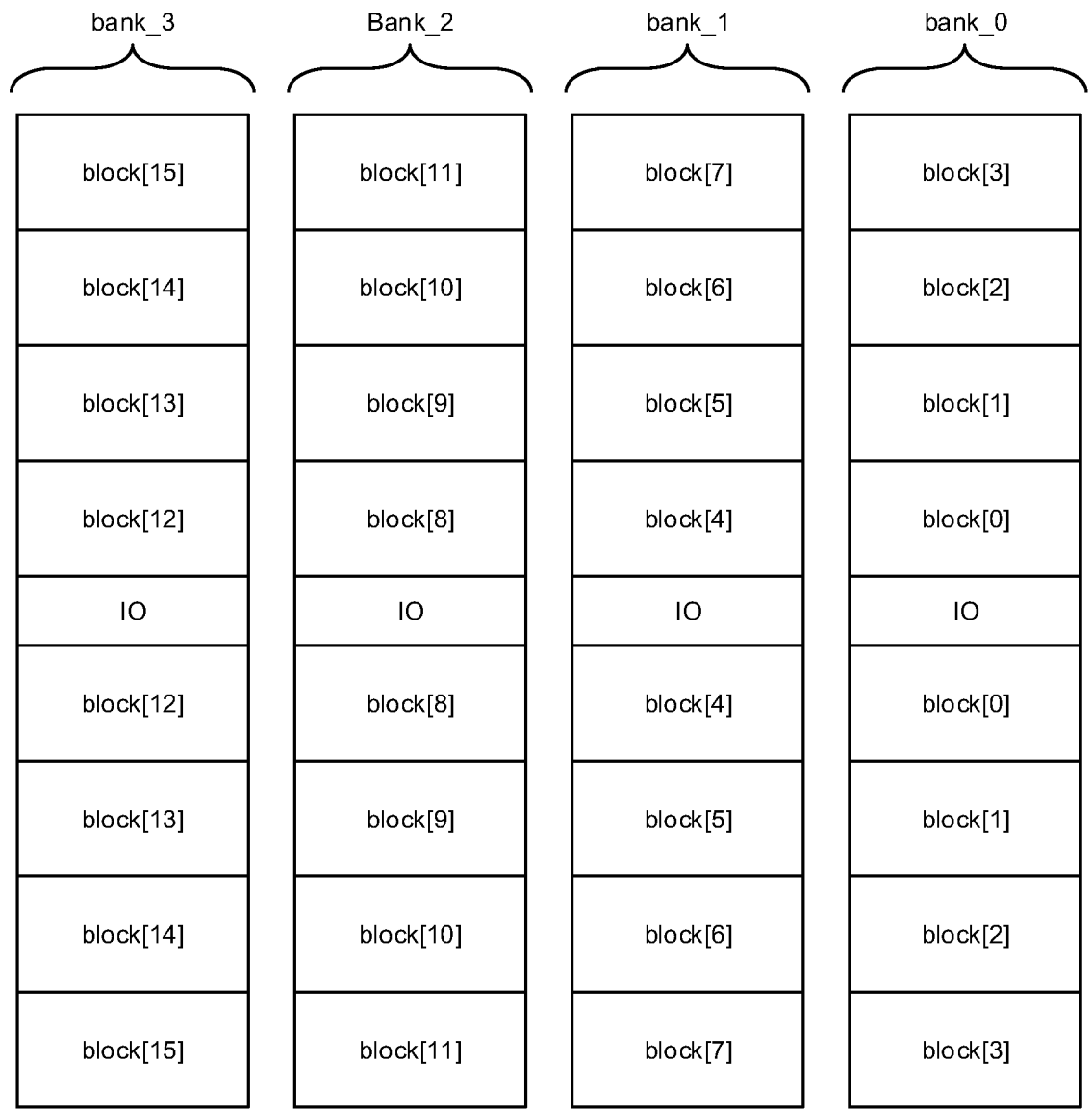
FIG. 7 illustrates a diagram of memory array circuitry with bitcells arranged in multiple banks of 128×16 arrays in accordance with implementations described herein.

FIG. 7 illustrates a diagram 700 of memory array circuitry 702 with the bitcells arranged in multiple banks of 128×16 arrays in accordance with various implementations described herein. In some implementations, the multiple blocks of 128×16 bitcell arrays may include four (4) banks of 128×16 memory arrays (bank_0, bank_1, bank_2, bank_3), wherein entry reads may be performed in reference to 16 entries with each entry having 64 bytes, which refers to 512 bits. Also, block reads may be performed in reference to 16 blocks of 32×16 arrays, wherein a single block read of 32×16 may be utilized to read 512 bitcells in two cycles during a block read operation.

As shown in FIG. 7, the memory array circuitry 702 includes multiple banks of 128×16 arrays (bank[0], bank[1], bank[2], bank[3]) with each having multiple blocks of 32×16 arrays (block[0], block[1], block[2], . . . , block[15]), which are based on multiple 8×8 arrays. For instance, the multiple banks of 128×16 arrays include a first 128×16 bank[0] array with four (4) blocks of 32×16 arrays (block[0], block[1], block[2], block[3]), and also, the multiple banks of 128×16 arrays may include a second 128×16 bank[1] array with four (4) blocks of 32×16 arrays (block[4], block[5], block[6], block[7]). In addition, the multiple banks of 128×16 arrays may include a third 128×16 bank[2] array with four (4) blocks of 32×16 arrays (block[8], block[9], block[10], block[11]), and also, the multiple banks of 128×16 arrays may include a fourth 128×16 bank[3] array with four (4) blocks of 32×16 arrays (block[12], block[13], block[14], block[15]). Also, in some instances, each 128×16 bank array (bank[0], bank[1], bank[2], bank[3]) may function and operate in a manner as described in reference to FIG. 6.

Moreover, in some implementations, the 1×8 bitcell array as shown in FIG. 3 may be extended or modified to include the four (4) 128×16 memory bank arrays (bank[0], bank[1], bank[2], bank[3]) with each having four (4) 32×16 arrays. For instance, the 1×8 array may be modified to include 32 copies of 8×8 bitcell arrays for each 128×16 bitcell bank array (bank[0], b[1], bank[2], bank[3]) so as to thereby provide the 4 banks of 128×16 memory arrays 702 of bitcells 204. In this instance, the 128×16 memory circuitry 602 as shown in FIG. 6 may be adapted to provide the 4 banks of 128×16 memory bitcell arrays that may include 4 copies of 128×16 memory arrays with each copy having five-hundred twelve (512) bitcells that are arranged in four (4) blocks of thirty-two (32) rows and sixteen (16) columns. Also, five-hundred twelve (512) bitcells in a first block and a second block of the 32×16 arrays in each bank may be read in a first single cycle, such as, e.g., a first read cycle (READ) during a read operation. Also, five-hundred twelve (512) bitcells in a third block and a fourth block of the 32×16 arrays in each bank may be read in a second single cycle, such as, e.g., a second read cycle (READ) during the read operation.

Therefore, a double-pulse read operation may be used to block read 2048 bits in 2 cycles, wherein 1024 bitcells are read in a first read cycle, and also 1024 other bitcells are read in a second read cycle. Further, the multiple banks of 128×16 bitcell bank arrays (bank[0], bank[1], bank[2], bank[3]) may be adapted and configured to allow for at least eight (8) wordlines (e.g., 8 vertical wordlines) to be active and read in each read cycle of the double-pulse read cycles (READ) during the read operation.

Figure 8:
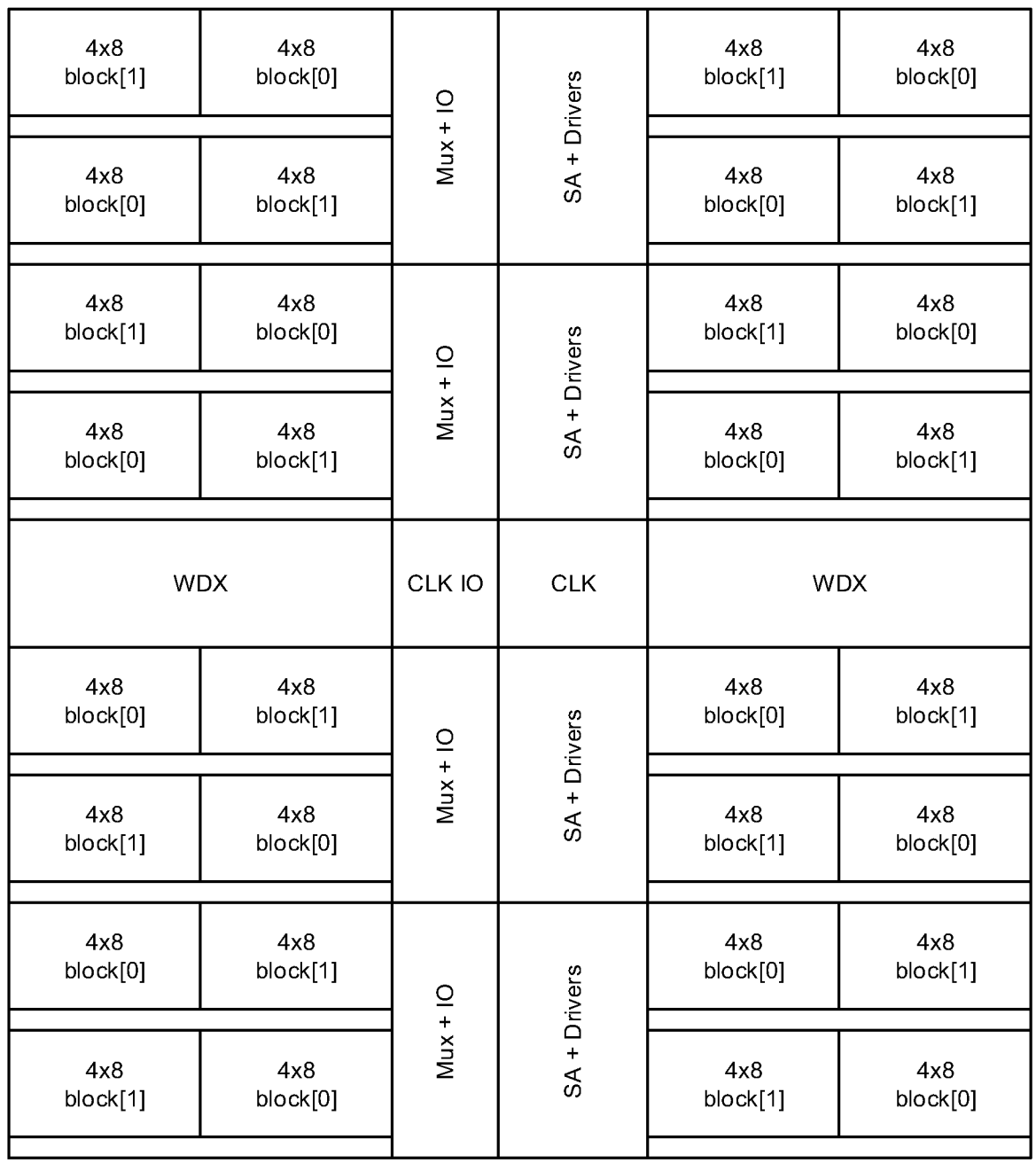
FIG. 8 illustrates a diagram of memory array circuitry with bitcells arranged in interleaved blocks of 64×16 arrays in accordance with implementations described herein.

FIG. 8 illustrates a diagram 800 of memory array circuitry 802 with the bitcells arranged in multiple interleaved blocks in a 64×16 bitcell array in accordance with various implementations described herein. In some implementations, the multiple blocks in 64×16 bitcell arrays may be block interleaved with eight (8) copies of 16×8, and block reads may be performed on 512 bitcells in a single cycle. When writing, column addresses (CA) may be interleaved based on corresponding row addresses (RA) for each block or for multiple blocks in each bank. In addition, each block of the multiple blocks for each bank may be interleaved during write operations, e.g., by interleaving column addresses (CA) based on row address (RA) for each block or the multiple blocks for each bank.

As shown in FIG. 8, the memory array circuitry 802 includes a 64×16 bitcell array having multiple interleaved 16×8 blocks with each having multiple 4×8 arrays. For instance, the multiple blocks of 16×8 arrays may include first 4×8 block arrays (block[0]) with sixteen (16) 8×8 arrays, and the multiple blocks of 16×8 arrays may include second 4×8 block arrays (block[1]) with sixteen (16) 8×8 arrays. Further, each 4×8 array (block[0], block[1]) may interleaved during a write operation. Moreover, in some implementations, five-hundred twelve (512) bitcells may be read in a single cycle, such as, e.g., a first read cycle (READ) during a read operation. Further, the multiple blocks of 4×8 bitcell arrays (block[0], block[1]) may be adapted and configured to allow for at least eight (8) wordlines (e.g., 8 vertical wordlines) to be active and read in each read cycle of the single-pulse read cycle (READ) during the read operation.

Figure 9:
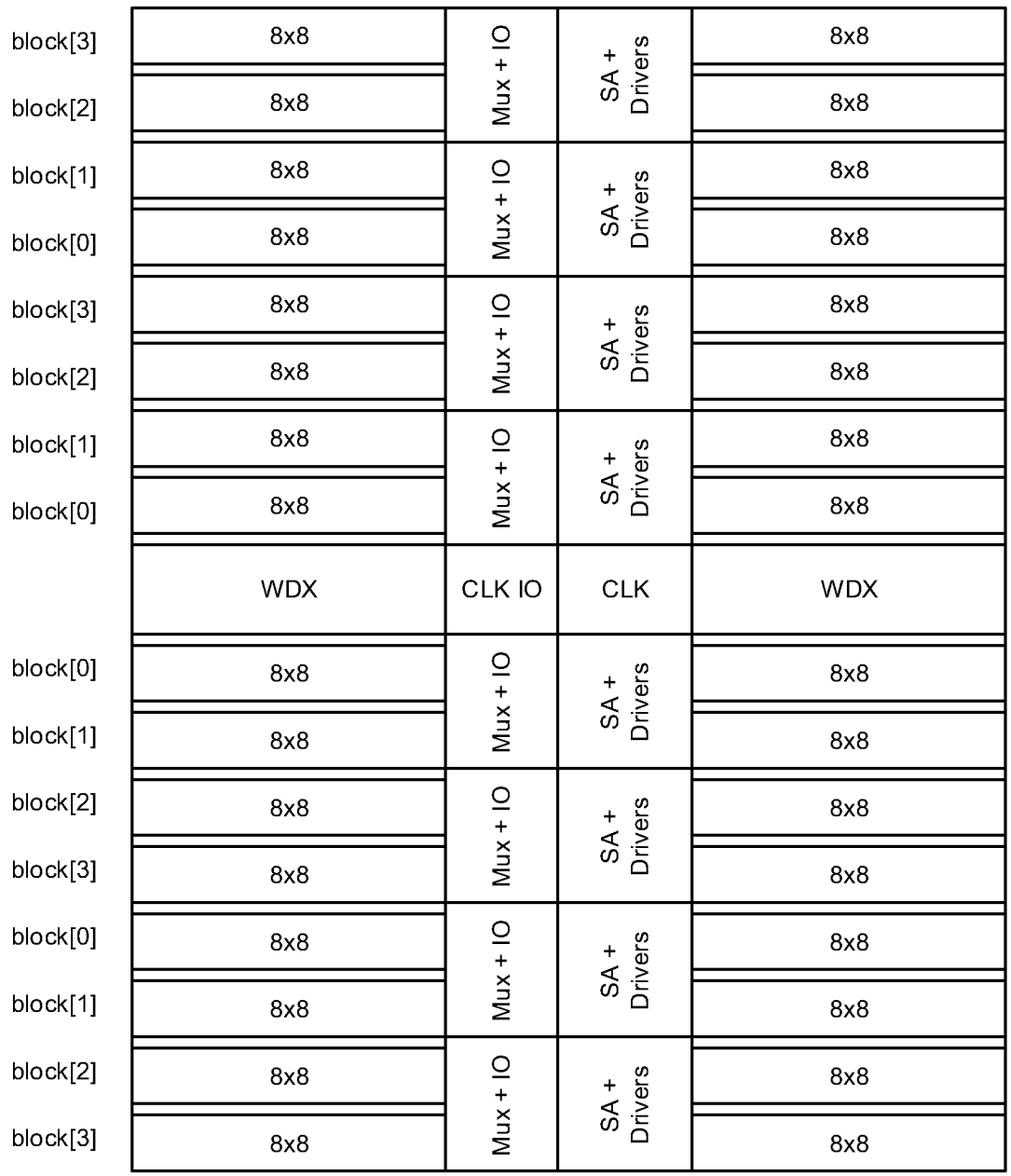
FIG. 9 illustrates a diagram of memory array circuitry with bitcells arranged in interleaved blocks of 32×16 arrays in accordance with implementations described herein.

FIG. 9 illustrates a diagram 900 of memory array circuitry 902 with the bitcells arranged in multiple interleaved blocks of 32×16 bitcell arrays in accordance with various implementations described herein. In some implementations, the multiple blocks of 16×8 bitcell arrays may be interleaved to distribute pins during a write operation, wherein block reads may be performed on the same 4 bytes from all 16 entries.

As shown in FIG. 9, the memory array circuitry 602 includes multiple blocks of 32×16 arrays with each having multiple interleaved blocks of 16×8 arrays, which each have two 8×8 arrays. For instance, the multiple blocks of 32×16 arrays may include first 32×16 block[0] arrays with eight (8) interleaved 8×8 arrays, and also, the multiple blocks of 32×16 arrays may include a second 32×16 block[1] array with eight (8) interleaved 8×8 arrays. In addition, the multiple blocks of 32×16 arrays may include a third 32×16 block[2] array with eight (8) 8×8 interleaved arrays, and also, the multiple blocks of 32×16 arrays may include a fourth 32×16 block[3] array with eight (8) interleaved 8×8 arrays. Also, in some instances, each 32×16 interleaved array (block[0], block[1], block[2], block[3]) may function and operate in a manner as described in FIGS. 5-6.

Moreover, in some implementations, five-hundred twelve (512) bitcells in a first block and a second block of the 32×16 arrays (block[0], block[1]) may be read in a first single read cycle (READ) during a read operation. Also, five-hundred twelve (512) bitcells in a third block and a fourth block of the 32×16 arrays (block[2], block[3]) may be read in a second single read cycle (READ) during the read operation. Therefore, a double-pulse read operation may be used to block read 1024 bits in 2 cycles, wherein 512 bitcells are read in a first read cycle, and 512 other bitcells are read in a second read cycle. Further, the multiple blocks of 32×16 bitcell block arrays (block[0], block[1], block[2], block[3]) may be adapted and configured to allow for at least eight (8) wordlines (8 vertical wordlines) to be active and read in each read cycle of the double-pulse read cycles.

Figure 10B:
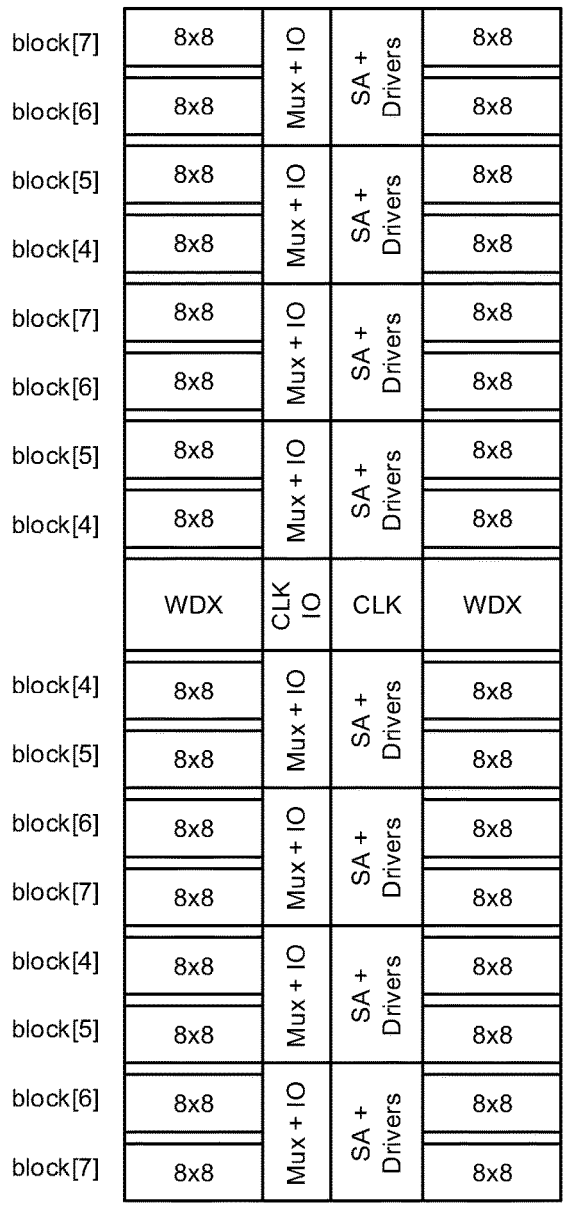
Figure 10B:
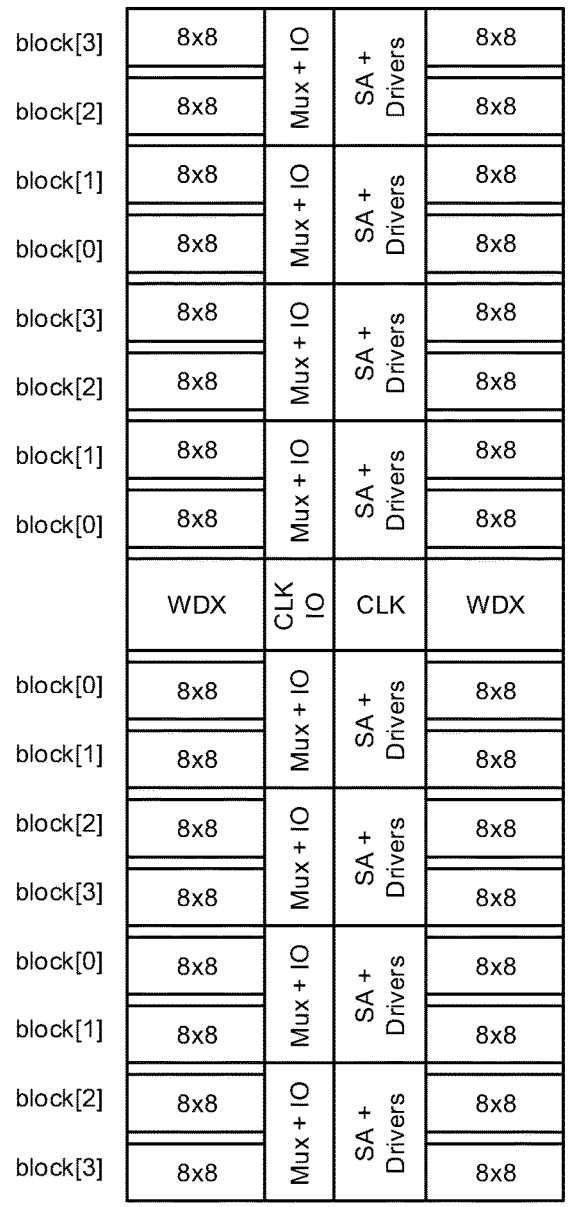

FIGS. 10A-10B illustrate multiple diagrams 1000A, 1000B of memory array circuitry 1002A, 1002B with the bitcells in multiple banks of 128×16 arrays in accordance with implementations described herein. In some implementations, each 128×16 bank of the multiple banks of 128×16 arrays are arranged in multiple interleaved blocks of 32×16 bitcell arrays, and the multiple blocks of 16×8 bitcell arrays may be interleaved to distribute pins during a write operation, wherein block reads may be performed on the same 4 bytes from all 16 entries. Further, in some implementations, the memory array circuitry 1002A, 1002B may include four (4) banks of 128×16 memory arrays, wherein 16 entries may be read during an entry read operation with each entry having 64 bytes (512 bits). Also, in reference to a block read operation, 16 blocks of 32×16 bitcells may be read in two cycles, wherein a single block of 32×16 (512 bits) may be read in two cycles.

As shown in FIGS. 10A-10B, the multi-bank memory array circuitry 1000A, 1000B includes multiple banks of 128×16 arrays (bank[0], bank[1], bank[2], bank[3]) with each having multiple interleaved blocks of 32×16 arrays (block[0], block[1], block[2], . . . , block[15]), which are based on multiple interleaved 16×8 arrays. For instance, the multiple banks of 128×16 arrays include a first 128×16 bank[0] array with four (4) interleaved blocks of 32×16 arrays (block[0], block[1], block[2], block[3]), and also, the multiple banks of 128×16 arrays may include a second 128×16 bank[1] array with four (4) interleaved blocks of 32×16 arrays (block[4], block[5], block[6], block[7]). In addition, the multiple banks of 128×16 arrays may include a third 128×16 bank[2] array with four (4) interleaved blocks of 32×16 arrays (block[8], block[9], block[10], block[11]), and also, the multiple banks of 128×16 arrays may include a fourth 128×16 bank[3] array with four (4) interleaved blocks of 32×16 arrays (block[12], block[13], block[14], block[15]). Further, in various instances, each 128×16 bank array (bank[0], bank[1], bank[2], bank[3]) may function, operate and/or behave in a manner as described in reference to FIGS. 6-9.

Moreover, in some implementations, the 1×8 bitcell array as shown in FIG. 3 may be extended or modified to include the four (4) 128×16 memory bank arrays (bank[0], bank[1], bank[2], bank[3]) with each having four (4) interleaved 32×16 bitcell arrays. For instance, the 1×8 array may be modified to include 32 copies of interleaved 8×8 bitcell arrays for each 128×16 bitcell bank array (bank[0], b[1], bank[2], bank[3]) so as to thereby provide 4 banks of 128×16 memory arrays 702 of bitcells 204. In this instance, the 128×16 memory circuitry 1002A, 1002B as shown in FIG. 10A-10B may be adapted to provide the 4 banks of 128×16 memory bitcell arrays that may include 4 copies of 128×16 memory arrays with each copy having five-hundred twelve (512) bitcells that are arranged in four (4) interleaved blocks of thirty-two (32) rows and sixteen (16) columns. Also, five-hundred twelve (512) bitcells in a first block and a second block of the 32×16 arrays in each bank may be read in a first single read cycle during a read operation. In addition, five-hundred twelve (512) bitcells in a third block and a fourth block of the 32×16 arrays in each bank may be read in a second single read cycle during the read operation.

Therefore, a double-pulse read operation may be used to block read 1024 bits in 2 cycles, wherein 512 bitcells are read in a first read cycle, and also 512 other bitcells are read in a second read cycle. Further, the multiple banks of 128×16 bitcell bank arrays (bank[0], bank[1], bank[2], bank[3]) may be adapted and configured to allow for at least eight (8) wordlines (e.g., 8 vertical wordlines) to be active and read in each read cycle of the double-pulse read cycles (READ) during the read operation.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include a bitcell. The device may include horizontal bitlines coupled to the bitcell, and the horizontal bitlines may include multiple first read bitlines disposed in a horizontal direction with respect to the bitcell. The device may include vertical bitlines coupled to the bitcell, and the vertical bitlines may include multiple second read bitlines disposed in a vertical direction with respect to the bitcell.

Described herein are various implementations of a device. The device may include an array of bitcells. The device may include horizontal bitlines coupled to the bitcells in the array, and the horizontal bitlines may include first read bitlines disposed in a horizontal direction with respect to the array of bitcells. The device may include vertical bitlines coupled to the bitcells in the array, and the vertical bitlines may include second read bitlines disposed in a vertical direction with respect to the array of bitcells.

Described herein are various implementations of a device. The device may include an array of bitcells that are arranged in multiple banks with each bank of the multiple banks having multiple blocks. The device may include horizontal bitlines coupled to the bitcells in the array, and the horizontal bitlines may include first read bitlines disposed in a horizontal direction with respect to the array of bitcells. The device may include vertical bitlines coupled to the bitcells in the array, and the vertical bitlines may include second read bitlines disposed in a vertical direction with respect to the array of bitcells.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   a bitcell;
   horizontal bitlines coupled to the bitcell, the horizontal bitlines including multiple first read bitlines disposed in a horizontal direction with respect to the bitcell; and
   vertical bitlines coupled to the bitcell, the vertical bitlines including multiple second read bitlines disposed in a vertical direction with respect to the bitcell, wherein the second read bitlines include at least eight (8) vertical read bitlines.

2. The device of claim 1, wherein the bitcell is a single bitcell having eight (8) transistors that are arranged and configured to provide an 8-transistor (8T) bitcell.

3. The device of claim 1, wherein the horizontal bitlines include a first write bitline and a second write bitline that is a complement to the first write bitline.

4. The device of claim 1, wherein the first read bitlines include four (4) horizontal read bitlines that are disposed in the horizontal direction with respect to the bitcell.

5. The device of claim 1, wherein the eight (8) vertical read bitlines are disposed in the vertical direction with respect to the bitcell.

6. The device of claim 1, wherein the device comprises multiple wordlines including a write wordline, a read wordline, and a global read wordline.

7. A device, comprising:
an array of bitcells;
horizontal bitlines coupled to the bitcells in the array, the horizontal bitlines including first read bitlines disposed in a horizontal direction with respect to the array of bitcells; and
vertical bitlines coupled to the bitcells in the array, the vertical bitlines including second read bitlines disposed in a vertical direction with respect to the array of bitcells, wherein the second read bitlines include at least eight (8) vertical read bitlines.

8. The device of claim 7, wherein the horizontal bitlines are coupled to each bitcell of the bitcells in the array, and wherein each bitcell has eight (8) transistors that are arranged and configured to provide an 8-transistor (8T) bitcell.

9. The device of claim 7, wherein:
the first read bitlines include four (4) horizontal read bitlines that are disposed in the horizontal direction with respect to the bitcell, and
the eight (8) vertical read bitlines are disposed in the vertical direction with respect to the bitcell.

10. The device of claim 7, wherein:
the horizontal bitlines include a first write bitline and a second write bitline that is a complement to the first write bitline, and
the device comprises multiple wordlines including a write wordline, a read wordline, and a global read wordline.

11. A device, comprising:
an array of bitcells;
horizontal bitlines coupled to the bitcells in the array, the horizontal bitlines including first read bitlines disposed in a horizontal direction with respect to the array of bitcells; and
vertical bitlines coupled to the bitcells in the array, the vertical bitlines including second read bitlines disposed in a vertical direction with respect to the array of bitcells,
wherein:
the array of bitcells includes at least eight (8) bitcells that are arranged in a single row with eight (8) columns, and at least four (4) bitcells of the bitcells in the array are read in a single cycle.

12. The device of claim 11, wherein:
the array of bitcells includes sixty-four (64) bitcells that are arranged in eight (8) rows with eight (8) columns, and
thirty-two (32) bitcells of the bitcells in the array are read in a single cycle.

13. The device of claim 11, wherein:
the array of bitcells includes one-hundred twenty-eight (128) bitcells that are arranged in two (2) blocks of eight (8) rows with eight (8) columns,
sixty-four (64) bitcells of the bitcells in a first block of the two (2) blocks are read in a first cycle, and
sixty-four (64) bitcells of the bitcells in a second block of the two (2) blocks are read in a second cycle.

14. The device of claim 13, wherein:
the device includes a first logic array coupled to the sixty-four (64) bitcells in the first block for accessing data stored in the first block, and
the device includes a second logic array coupled to the sixty-four (64) bitcells in the second block for accessing data stored in the second block.

15. The device of claim 11, wherein:
the array of bitcells includes five-hundred twelve (512) bitcells that are arranged in four (4) blocks of sixteen (16) rows with eight (8) columns,
two-hundred fifty-six (256) bitcells of the bitcells in a first block and a second block of the four (4) blocks are read in a first cycle, and
two-hundred fifty-six (256) bitcells of the bitcells in a third block and a fourth block of the four (4) blocks are read in a second cycle.

16. The device of claim 11, wherein:
the array of bitcells includes five-hundred twelve (512) bitcells that are arranged in the four (4) blocks of thirty-two (32) rows with sixteen (16) columns,
five-hundred and twelve (512) bitcells of the bitcells in a first block and a second block of the four (4) blocks are read in a first cycle, and
five-hundred and twelve (512) bitcells of the bitcells in a third block and a fourth block of the four (4) blocks are read in a second cycle.

17. A device, comprising:
an array of bitcells that are arranged in multiple banks with each bank of the multiple banks having multiple blocks;
horizontal bitlines coupled to the bitcells in the array, the horizontal bitlines including first read bitlines disposed in a horizontal direction with respect to the array of bitcells; and
vertical bitlines coupled to the bitcells in the array, the vertical bitlines including second read bitlines disposed in a vertical direction with respect to the array of bitcells,
wherein the multiple banks include four (4) banks, and wherein the multiple blocks include four (4) blocks within each bank, and wherein:
the array of bitcells includes five-hundred twelve (512) bitcells that are arranged in the four (4) blocks of thirty-two (32) rows with sixteen (16) columns,
five-hundred and twelve (512) bitcells of the bitcells in a first block and a second block of the four (4) blocks in each bank are read in a first cycle.

18. The device of claim 17, wherein the horizontal bitlines are coupled to each bitcell of the bitcells in the array, and wherein each bitcell has eight (8) transistors that are arranged and configured to provide an 8-transistor (8T) bitcell.

19. The device of claim 17, wherein
five-hundred and twelve (512) bitcells of the bitcells in a third block and a fourth block of the four (4) blocks in each bank are read in a second cycle.

20. A device, comprising:
- an array of bitcells that are arranged in multiple banks with each bank of the multiple banks having multiple blocks;
- horizontal bitlines coupled to the bitcells in the array, the horizontal bitlines including first read bitlines disposed in a horizontal direction with respect to the array of bitcells; and
- vertical bitlines coupled to the bitcells in the array, the vertical bitlines including second read bitlines disposed in a vertical direction with respect to the array of bitcells, wherein each block of the multiple blocks for each bank is interleaved during write operations by interleaving a column address based on a row address for each block or the multiple blocks for each bank.

* * * * *